United States Patent
Agarwal et al.

(10) Patent No.: US 7,426,127 B2
(45) Date of Patent: Sep. 16, 2008

(54) FULL-RAIL, DUAL-SUPPLY GLOBAL BITLINE ACCELERATOR CAM CIRCUIT

(75) Inventors: Amit Agarwal, Hillsboro, OR (US); Steven Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 11/642,838

(22) Filed: Dec. 21, 2006

(65) Prior Publication Data

US 2008/0151588 A1 Jun. 26, 2008

(51) Int. Cl.
 *G11C 15/00* (2006.01)
(52) U.S. Cl. ................................. 365/49; 365/189.06
(58) Field of Classification Search .................. 365/49, 365/189.06
 See application file for complete search history.

(56) References Cited

U.S. PATENT DOCUMENTS 7,057,913 B2    6/2006  Hsu et al. ..................... 365/49
2003/0058721 A1*  3/2003  Chehrazi et al. ............. 365/204
2005/0073879 A1*  4/2005  Gogl et al. ................... 365/158
2005/0180224 A1*  8/2005  Tzartzanis et al. ...... 365/189.09
2005/0237784 A1* 10/2005  Kang .......................... 365/145
2005/0237805 A1* 10/2005  Matsuzaki et al. ...... 365/185.13
2007/0035992 A1*  2/2007  Curatolo et al. ........ 365/185.02

OTHER PUBLICATIONS

Agarwal et al. "A Dual-Supply 4GHz 13fJ/bit/search 64x128b CAMin 65nm CMOS" 1-4244-0303-4/06, 2006 IEEE pp. 303-306.

* cited by examiner

*Primary Examiner*—Michael T Tran
(74) *Attorney, Agent, or Firm*—Ked & Associates, LLP

(57) ABSTRACT

A content-addressable memory circuit includes a first local bit line coupled to a first memory location, a second local bit line coupled to a second memory location, a global bit line coupled to the first and second local bit lines and a global bit line accelerator coupled to the first and second local bit lines and the global bit line. The global bit line accelerator sets the second local bit line to a first logical value depending on a signal from the first local bit line. In this way, the global bit line accelerator accelerates the evaluation phase of operation of the second local bit line.

20 Claims, 5 Drawing Sheets

FULL-RAIL, DUAL-SUPPLY GLOBAL BITLINE ACCELERATOR CAM CIRCUIT

FIELD

The present invention relates in at least some of its embodiments to data storage circuits.

BACKGROUND

A content-addressable memory (CAM) is unique in terms of the way in which it accesses stored data. In more traditional forms of memory, each data item is assigned a specific memory address. This address is then used as a basis for performing all storage and retrieval operations for that item. CAM-type memories, however, take an entirely different approach.

Instead of accessing data by memory address, the value of the data itself determines how it is accessed and in some cases where the data is stored or otherwise indexed. In order to implement this alternative addressing scheme, value-matching logic compares input data to the data stored in each location of the memory. An indicator signal is then generated to identify the location(s) where a match (or "hit") exists. Subsequent operations (e.g., read) may then be performed on the data stored at these locations.

Content addressable memories are also known as associative memories and may be used to form the basic components of many circuits including caches, memory management units, and translation look-aside buffers. CAMs are also used in TCP/IP acceleration chips and networking chips to, for example, form look-up tables and support packet forwarding and classification operations in switches and routers.

DETAILED DESCRIPTION

Figure 1:
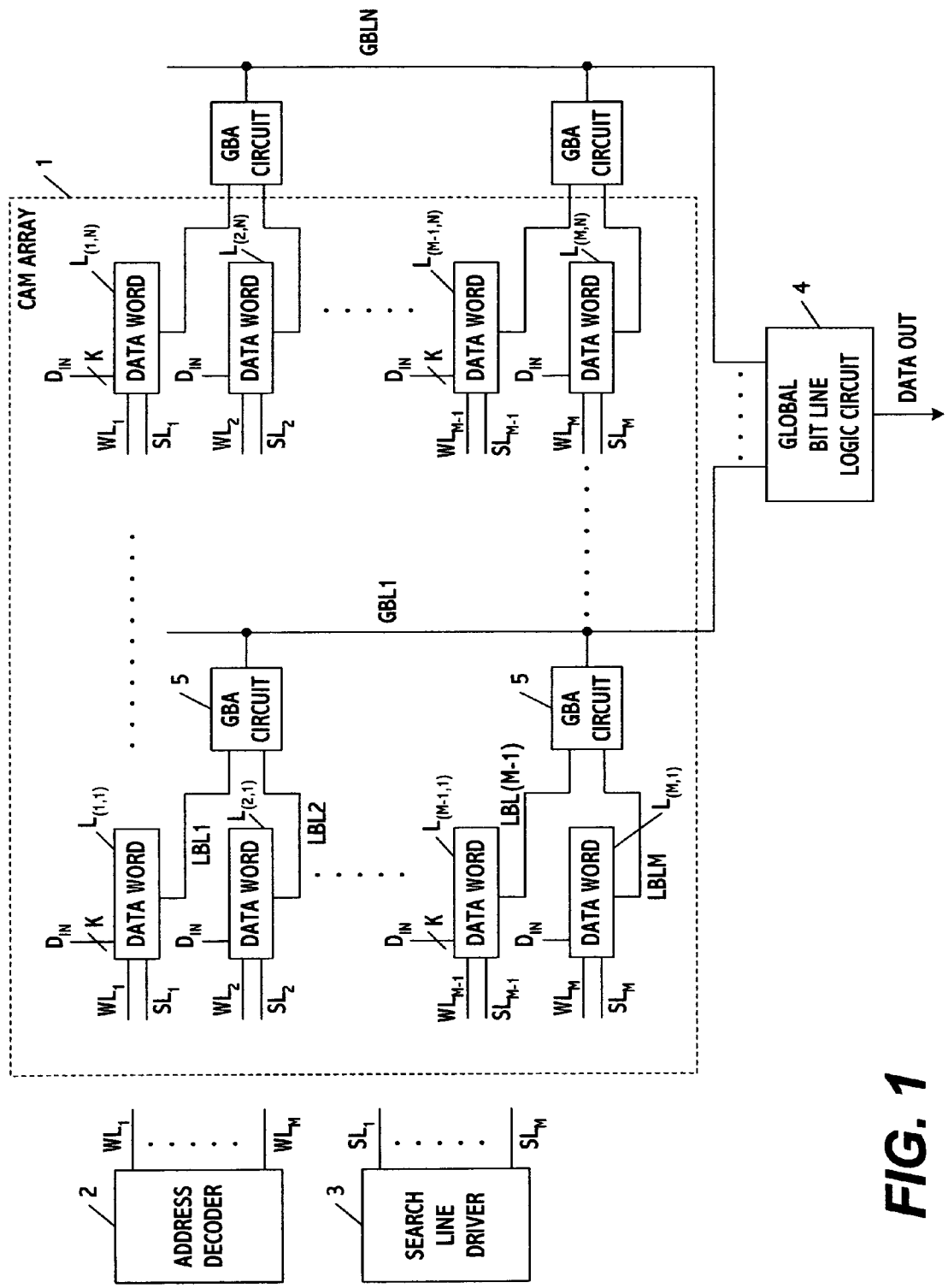
FIG. 1 is a diagram showing a content-addressable memory in accordance with one embodiment of the present invention.

FIG. 1 shows a content-addressable memory circuit in accordance with one embodiment of the present invention. This circuit includes a CAM array 1 formed from a plurality of memory locations $L_{(1,1)}$-$L_{(M,N)}$ which, for example, may be arranged in a matrix of M rows and N columns, where $M \geq 1$ and $N \geq 1$. The values of M and N may be selected to satisfy the storage requirements of an intended application. Each memory location stores a data word that is a predetermined number of bits (k) in length.

The CAM array includes a plurality of word lines $WL_1$-$WL_M$ and a plurality of data lines Din. Each word line is coupled to the cells (bits) in a respective one of the memory locations, e.g., word line $WL_1$ is connected to the bits in each of locations $L_{(1,1)} \ldots L_{(1,N)}$, word line $WL_2$ is connected to the bits in each of locations $L_{(2,1)} \ldots L_{(2,N)}$, etc. Address decoder 2 controls the logical values of the word lines.

The data lines Din input the bits of a data word to be searched into the memory locations of the CAM array. The input data may be k bits in length and the data lines may be provided as pairs of differential lines according to one embodiment. If in differential form, the pairs of differential bit lines may be connected to a sense amplifier circuit for logical voltage correction.

A search line driver 3 determines the values of the search lines. In performing this function, the search line driver may convert, or encode, k bits of search data into a combination of logical values, which are then simultaneously applied in parallel to the memory locations in the CAM array. The combination of logical values may be synchronously generated by driver 3 based on an input clock signal. The logical values are output on a respective number of search lines $SL_1$-$SL_M$ coupled to the cells in the CAM array.

Each memory location may include, or be coupled to search (evaluate), logic that compares the input data to the data word stored in that location. The search logic is arranged to output a signal, which corresponds to a result of the comparison, to a respective one of the local bit lines LBL. The comparison may be performed synchronously based on the value of a clock signal and based on the logical values of the search and word lines or based on another search (evaluate) logic scheme.

Figure 2:
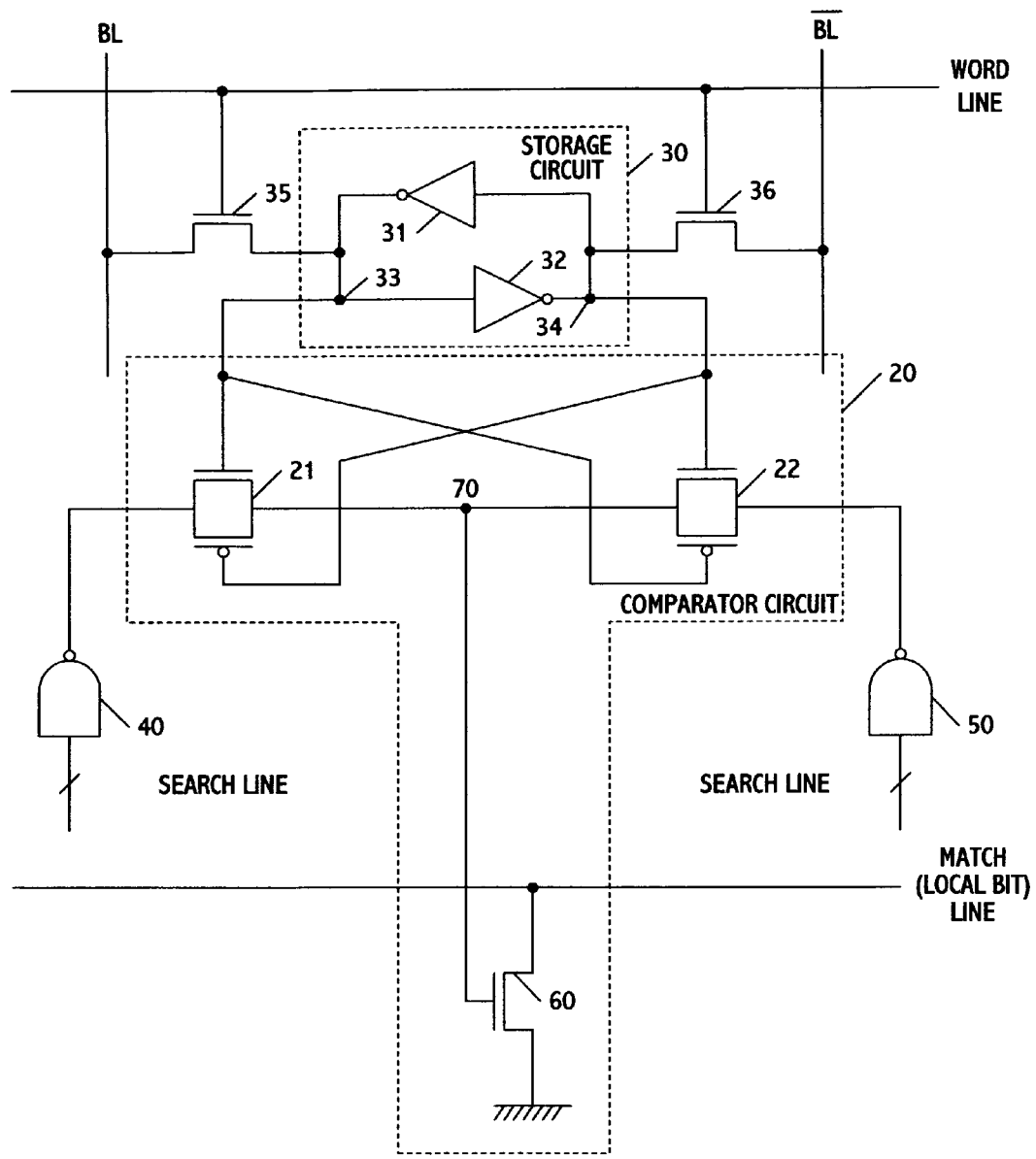
FIG. 2 is a diagram showing an example of search and storage circuits that may be associated with each bit of a plurality of memory locations in the memory of FIG. 1.

FIG. 2 shows an example of the storage and search logic for each cell in the CAM array. As shown, each cell may include a comparator circuit 20 and a storage circuit 30. The storage circuit includes two inverters 31 and 32 that form a keeper circuit for storing logical values at nodes 33 and 34. These nodes are coupled to a differential pair of bit lines BL and $\overline{BL}$ through transistors 35 and 36.

Transistor 35 has its source (drain) coupled to node 33 and its drain (source) coupled to bit line BL. Transistor 36 has its source (drain) coupled to node 34 and its drain (source) coupled to the complementary bit line. The gates of these transistors are coupled to a word line, so that when a word line is selected by the address decoder (e.g., pulled to a high logic state) transistors 35 and 36 are enabled to transfer data between node 33 and BL and between node 34 and $\overline{BL}$ respectively. That is, the storage circuit of the cell stores a voltage corresponding to a logical 0 or 1 when the word line is selected.

The comparator includes a cross-connection of transmission gates 21 and 22. In this example, the gates are connected to perform a logic function (e.g., an XNOR operation), where node 34 generates the complement of node 33 and the output of logic 50 is the complement of logic 40. The pass characteristics of the transmission gates are controlled by the voltages at nodes 33 and 34. When the transmission gates are activated, they pass respective values output from logic gates 40 and 50. The value output from gate 40 is based on a logical combination of one or more search lines and the value output from gate 50 is based on a logical combination of one or more search lines, which may be different from the first combination. Gates 40 and 50 are shown as NAND gates but other logical circuits may alternatively be used. Also, gates 21 and 22 may be connected to perform other logic operations, e.g., NAND, NOR, XOR, etc.

Circuit 20 performs the function of comparing the logical values output from gates 40 and 50 to the values stored at the opposing nodes in circuit 30. If no match exists, a voltage signal is applied from node 70 to the gate of transistor 60 to discharge the match line to a reference potential, e.g., ground or otherwise a logical 0 value. If a match exists, no voltage signal is applied to the gate of transistor 60. As a result, the match line is not discharged and left to equal a logical 1 value. The match line may correspond to a local bit line in accordance with one or more of the embodiments described herein. In other embodiments, the logic may be reversed, e.g., a logical 0 value may correspond to a match and a logical 1 value may correspond to a mismatch.

While the FIG. 2 embodiment may prove to be suitable for some applications, other configurations may be used to form the comparator and storage portions of the CAM cell for other applications. In view of the foregoing, it is therefore clear that the CAM cell is a memory cell which includes compare circuitry embedded in it. This allows all entries to be compared at the same time.

Referring again to FIG. 1, each column of the CAM array also includes a plurality of local bit lines LBL1-LBLM, which are coupled to one of a plurality of global bit lines GBL1-GBLN. That is, local bit lines LBL1-LBLM in the first column are coupled to global bit line 1, local bit lines LBL1-LBLM in the second column are coupled to global bit line 2, and so on. As indicated by the connections in FIG. 1, the logical values on the local bit lines in each column control the value of a corresponding one of the global bit lines. The global bit line values are then input into a global bit line logic circuit 4, which outputs data corresponding to a read operation based on the address of a memory location that matched the input data.

The content-addressable memory also includes one or more global bit line accelerator (GBA) circuits 5. In accordance with one embodiment, multiple local bit lines in each column of the array are coupled to each GBA circuit. In the example shown, each GBA circuit is coupled to the local bit lines of two adjacent memory locations. In another embodiment, each GBA circuit may be coupled to non-adjacent local bit lines in the same column or even different columns. In other embodiments, more than two local bits lines may be coupled to each GBA circuit.

Figure 3:
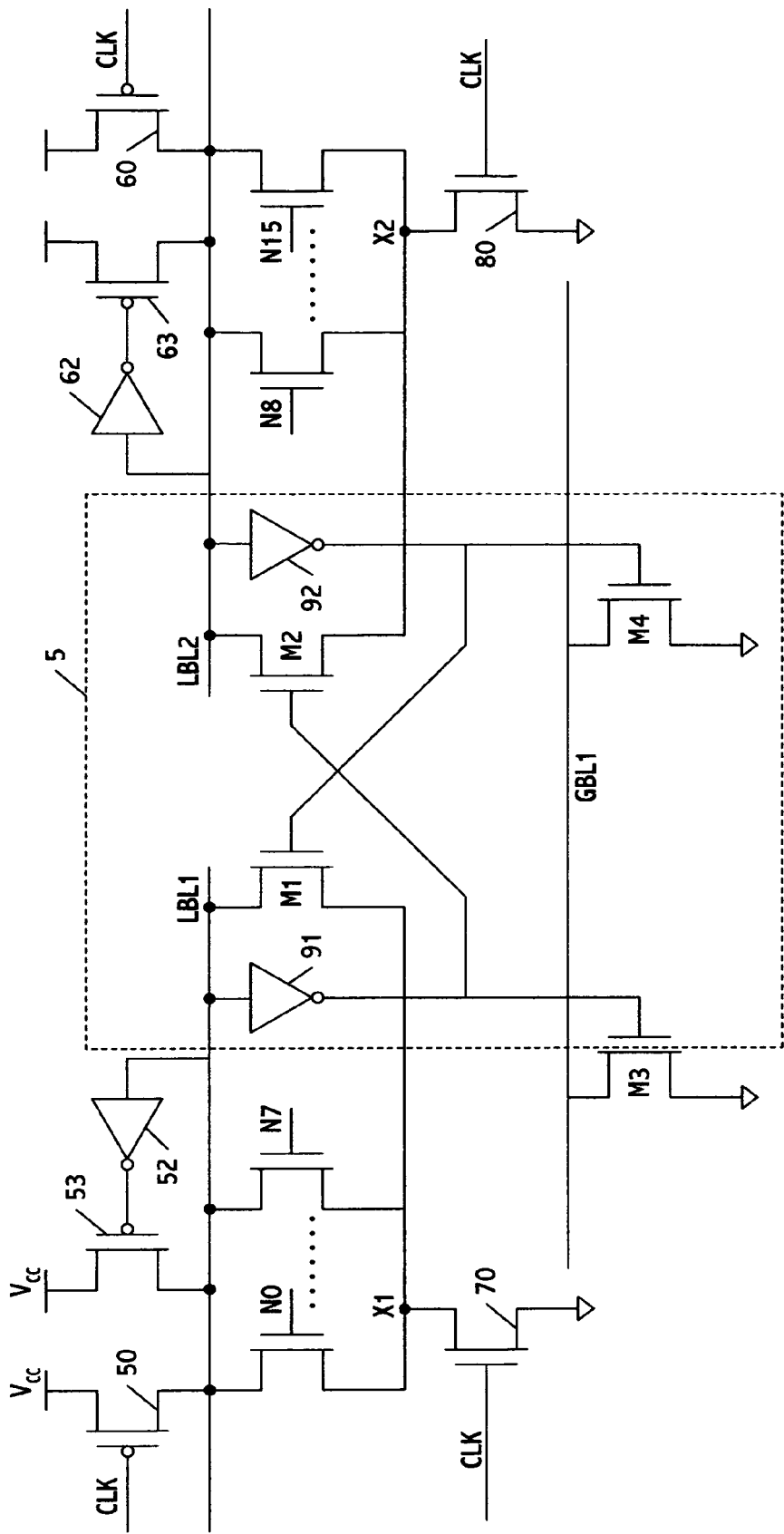
FIG. 3 is a diagram showing a global bit line accelerator circuit that may be included in the content-addressable memory of FIG. 1.

FIG. 3 shows an example of how each of the GBA circuits in FIG. 1 may be constructed. In this example, the GBA circuit is disposed between the search and pre-charge logic of two adjacent local bit lines, which, for example, may correspond to LBL1 and LBL2 in FIG. 1.

The pre-charge logic for LBL1 includes transistor 50 and the pre-charge logic for LBL2 includes transistor 60. These transistors operate to charge their respective local bit lines to a predetermined logical value before the search/evaluate phase of operation. For example, when clock signal CLK is low, transistors 50 and 60 are turned on to charge LBL1 and LBL2 to a logical 1 value based on supply voltage $V_{cc}$. At this time, a low CLK signal turns off transistor 70 to thereby prevent local bit line LBL1 from discharging should any of transistors 51-58 inadvertently turn on.

When CLK goes high, transistor 50 is turned off and transistor 70 is turned on. At this time, the search/evaluate logic provided for each bit of memory location $L_{(1,1)}$ compares a respective one of the input data bits, Din, to its stored value. If any of the bits in the memory location do not match the input data bit, the search/evaluate logic for that bit generates a gate signal which turns on a corresponding one of transistors N0-N7. As a result, local bit line LBL1 discharges to a logical 0 value based on a signal path established to ground through at least one of transistors N0-N7 and transistor 70. In this exemplary embodiment, transistors N0-N7 therefore operate in a manner analogous to transistor 60 in FIG. 2. The search and storage logic used for each bit of $L_{(1,1)}$ may also be similar to that shown in FIG. 2.

During the search/evaluate phase, inverter 52 and transistor 53 operate in tandem to maintain LBL1 at a logical 1 value when the search logic determines that the data word stored in memory location $L_{(1,1)}$ matches the input data value. That is, when a match exists, inverter 52 inverts the logical 1 value on LBL1 to logical zero. This value, then, turns on transistor 53 which maintains LBL1 in a logical 1 state. Conversely, when the data word stored in memory location $L_{(1,1)}$ does not match the input data value, LBL1 discharges to a logical 0 value.

Analogously, when CLK goes high, transistor 60 is turned off and transistor 80 is turned on. At this time, the search/evaluate logic provided for each bit at memory location $L_{(2,1)}$ compares a respective one of the input data bits, Din, to its stored value. If any of the bits in the memory location do not match the input data bit, the search/evaluate logic for that bit generates a gate signal which turns on a corresponding one of transistors N8-N15. As a result, local bit line LBL2 discharges to a logical 0 value based on a signal path established to ground through at least one of transistors N8-N15 and transistor 80. In this exemplary embodiment, transistors N8-N15 therefore operate a manner analogous to transistor 60 in FIG. 2. The search and storage logic used for each bit may also be similar to that shown in FIG. 2.

During the search/evaluate phase, inverter 62 and transistor 63 operate in tandem to maintain LBL2 at a logical 1 value when the search logic determines that the data word stored in memory location $L_{(2,1)}$ matches the input data value. That is, when a match exists, inverter 62 inverts the logical 1 value on LBL2 to a logical 0 value. This value, then, turns on transistor 63 which maintains LBL2 in a logical 1 state. Conversely, when the data word stored in memory location $L_{(2,1)}$ does not match the input data value, LBL2 discharges to a logical 0 value.

As shown in FIG. 3, one embodiment of the global bit line accelerator circuit is formed to include first and second inverters 91 and 92 and a cross-coupled connection of transistors M1 and M2. The first inverter 91 is coupled to invert the logical value on bit line LBL1 to form a gate signal for transistor M3, which is coupled to the global bit line GBL1. The second inverter 92 is coupled to invert the logical value on bit line LBL2 to form a gate signal for transistor M4, which is also coupled to GBL1.

In the cross-coupled connection of transistors, transistor M1 is connected in parallel to first inverter 91 and transistors N0-N7 and transistor M2 is connected in parallel to second inverter 92 and transistors N8-N15. In this arrangement, the drain of transistor M1 coupled to local bit line LBL1 and its source coupled to node x1, which in turn is connected to the sources of transistors N0-N7. Analogously, the drain of transistor M2 is coupled to local bit line LBL2 and its source is coupled to node x2, which in turn is connected to the sources of transistors N8-N15.

In operation, the GBA circuit operates to accelerate the evaluation phase of one of the local bits lines, LBL1 and LBL2, when the other bit line assumes a logical 0 value. For example, when the search logic for memory location $L_{(1,1)}$ determines that a "miss" exists (e.g., the stored value does not match Din), local bit line LBL1 undergoes a discharging operation. As LBL1 is discharging, the logical value on local bit line LBL2 is forced to also assume a logical 0 value, thereby accelerating the evaluation operation of memory location $L_{(2,1)}$. As a result, the logical value on global bit line GBL1 is controlled in a faster and more efficient manner based on the logical values of LBL1 and LBL2.

The global bit line GBL1 is able to be controlled in a faster manner as a result of LBL1 and LBL2 being in the same column of the CAM array. That is, GBL1 will assume logical 0 value if a "miss" occurs in one or more memory locations associated with GBL1. Thus, once a "miss" is determined to exist in a corresponding column of the CAM array, the logical value of GBL1 can be immediately determined.

Taking these circumstances into consideration, when LBL1 is pulled down to a logical 0 value as a result of a "miss" in memory location $L_{(1,1)}$, the logical 0 value on LBL1 is inverted by inverter 91 to generate a gate signal which turns on transistor M3. Thus, GBL1 begins to discharge. Concurrently, the logical 1 value output from inverter 91 turns on transistor M2, which causes local bit line LBL2 to discharge (e.g., assume a logical 0 value) through transistor 80. The logical 0 value of LBL2 is inverted by inverter 92 to generate a gate signal which turns on transistor M4, which assists in discharging global bit line GBL1 to a logical 0 value.

Of course, when LBL1 and LBL2 remain at logical 1 values as a result of "hits" for memory locations $L_{(1,1)}$ and $L_{(2,1)}$, transistors N0-N17 are maintained in an off state and inverters 91 and 92 independently control the values of local bit lines LBL1 and LBL2. That is, cross-coupled transistors M1 and M2 play no part in controlling global bit line GBL1 when LBL1 and LBL2 are maintained at a logical 1 value after a hit occurs during the evaluation phase of operation.

The GBA circuit may therefore be used to replace so-called NAND circuits which are used in other types of CAM circuits to logically combine adjacent local bit line values. In accordance with one embodiment, inverters 91 and 92 may have the same strength to allow for a reduction in the total transistor width of the NMOS transistors, e.g., M1 and M2. This extra width may be used to size both inverters and pull-down transistors, M1 and M2, to minimize any affect on the capacitance of the local bit lines. Also, in the GBA circuit, the inverters may be formed with sufficient strength to drive both GBL pull-down transistors M3 and M4, as well as the local bit line NMOS feedback transistors.

The GBA circuit may also achieve extra local bit line discharge during a worst-case delay condition, while simultaneously not adding to the total worse-case energy since all the local bit lines evaluate in this condition. The GBA circuit may also compensate for performance loss due to reduction in supply voltage, and therefore may serve to provide a full-swing, low-power circuit which enables a reduction in LBL supply voltage without introducing a level converter, which is included in so many other CAM designs.

More specifically, to reduce the local bit line power during a search operation, the supply voltage of the local bit lines and the GBA circuits may be reduced. Remaining portions of the CAM (e.g., CAM cells, search lines, global bit lines, and clock) ma be retained at a high-$V_{cc}$. The GBA circuit output (which may be a low-$V_{cc}$ signal) is only connected to an NMOS pull-down transistor of the GBL (which may be a high-$V_{cc}$ gate). As a result, the CAM circuit does not require a level converter at the interface of low and high-$V_{cc}$ portions of the circuit.

Also, the GBL evaluation may be used to up-convert the low-$V_{cc}$ signal to a high-$V_{cc}$ signal, resulting in full rail at the output of the CAM. Additionally, the local bit lines may be pre-charged to low-$V_{cc}$ and may be driven by high-$V_{cc}$, which may improve the LBL delay. Without the GBA circuit, this may degrade the GBL delay (the GBL may be driven by low-$V_{cc}$). This performance loss is compensated for by the GBA circuit, resulting, for example, in the same performance as an all high-$V_{cc}$ implementation, while maintaining full rail at the primary inputs and outputs.

Figure 4:
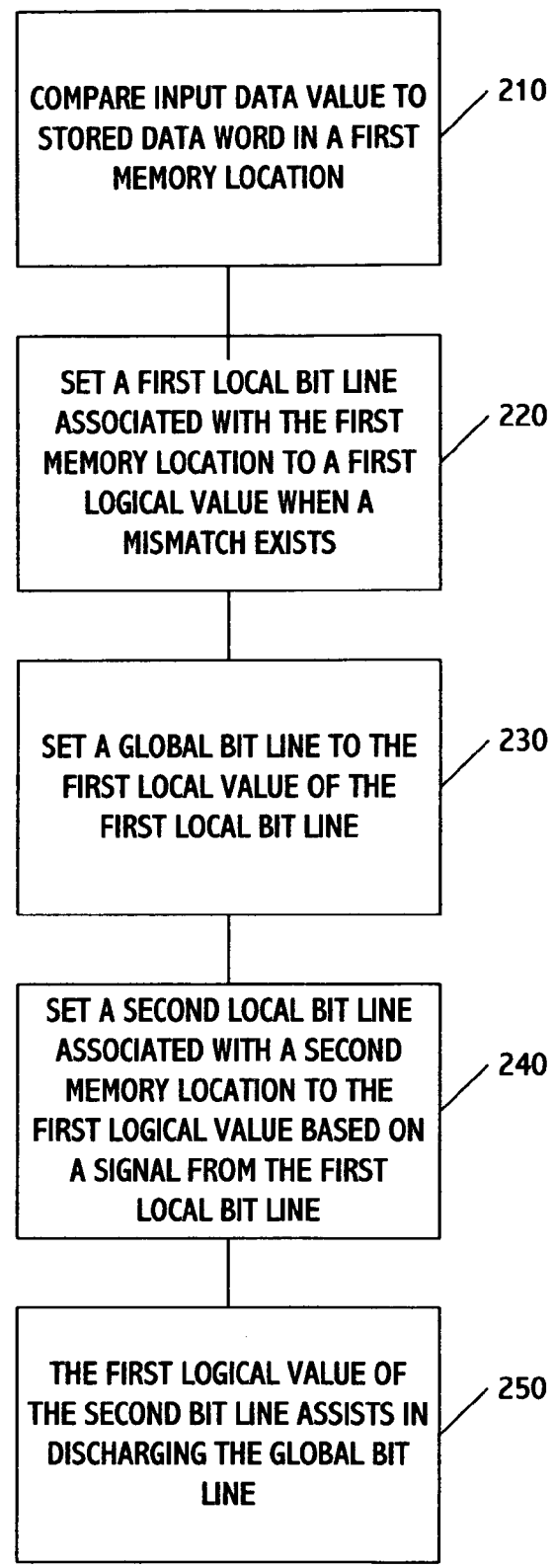
FIG. 4 is a diagram showing steps included in a method for operating a content-addressable memory in accordance with one embodiment of the present invention.

FIG. 4 shows operations that may be included in a method for controlling global bit lines in accordance with one embodiment of the present invention. According to this method, the search logic associated with a first memory location in a CAM array compares an input data value to a data word stored in that location. (Block 210). When the comparison indicates that a mismatch ("miss") exists, a first local bit line associated with the first memory location is set to a first logical value indicative of the match. (Block 220). In the circuit of FIG. 3, the first logical value may be a logical 0. Next, a global bit line coupled to the first local bit line is discharged to set the global bit line to the first logical value. (Block 230). This may be accomplished by inverting a signal that corresponds to the first logical value of the first local bit line and then controlling a gate of a pull-down transistor based on the inverted signal.

While the global bit line is discharging, the signal derived from the first local bit line (the inverted signal) is used to set the logical value of a second local bit line in the CAM array. (Block 240). The second local bit line is coupled to the same global bit line as the first local bit line, and may be associated with a second memory location which, for example, may be in the same row or column of the array as the first memory location. Also, the logical value of the second local bit line may correspond to the first logical value of the first local bit line. According to another embodiment, the second memory location may be a non-adjacent memory location. Setting the logical value of the second local bit line may be accomplished, for example, using the global bit line accelerator circuit previously discussed or another circuit.

The second logical value of the second local bit line is then used to assist in discharging (or charging) the global bit line. (Block 250). This may be accomplished by inverting a signal that corresponds to the second logical value of the second local bit line and then controlling a gate of another pull-down transistor based on the inverted signal.

Figure 5:
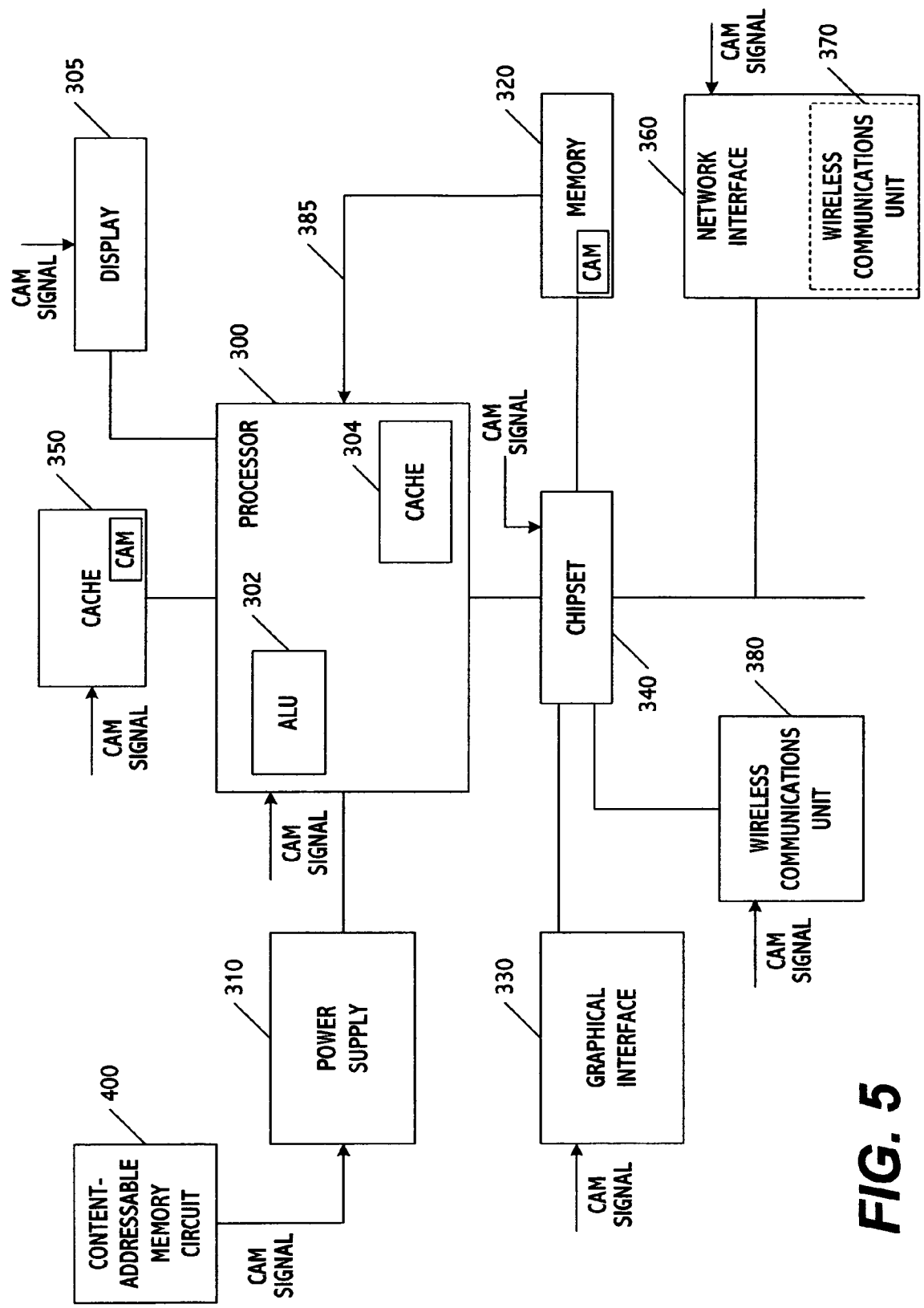
FIG. 5 is a diagram showing a system that may include a content-addressable memory in accordance with any of the aforementioned embodiments.

FIG. 5 shows a system which includes a processor 300, a power supply 310, and a memory 320 which, for example, may be a random-access memory. The processor includes an arithmetic logic unit 302 and an internal cache 304. The system may also include a graphical interface 330, a chipset 340, a cache 350, a network interface 360, and a wireless communications unit 370, which may be incorporated within the network interface. Alternatively, or additionally, the communications unit 380 may be coupled to the processor, and a direct connection may exist between memory 320 and the processor as well.

The processor may be a microprocessor or any other type of processor, and may be included on a chip die with all or any combination of the remaining features, or one or more of the remaining features may be electrically coupled to the microprocessor die through known connections and interfaces. Also, the connections that are shown are merely illustrative, as other connections between or among the elements depicted may exist depending, for example, on chip platform, functionality, or application requirements.

Any one of the aforementioned embodiments of the content-addressable memory circuit 400 of the present invention may be included, on- or off-chip, for inputting signals into one or more of the blocks in FIG. 6. For example, the aforementioned embodiments may be used to perform addressing in the external or internal caches or memory (e.g., random access memory). In other cases, the aforementioned embodiments may be included in a look-up table used, for example, in an Internet router. In this application, the Internet router forwards data packets to an incoming port using an address look-up table which may be searched in accordance with any one or more of the embodiments of the present invention.

Also, while cross-coupled transistors have been used to form the global bit line accelerator circuit in the foregoing embodiments, the cross-coupled transistors may be replaced by any one of a variety of switches in other embodiments. Also, while transistors M1-M4 and transistors 70, 80, and N0-N15 are shown in FIG. 3 as being implemented using n-type metal oxide semiconductor (NMOS) technology, in other embodiments p-type metal oxide semiconductor (PMOS) transistors may be used for any one or more of these transistors.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. A content-addressable memory circuit, comprising:
   a first local bit line coupled to a first memory location;
   a second local bit line coupled to a second memory location;
   a global bit line coupled to the first and second local bit lines; and
   a global bit line accelerator coupled to the first and second local bit lines and the global bit line, the global bit line accelerator to set the second local bit line to a first logical value depending on a signal from the first local bit line indicating that the first local bit line is set to the first logical value.

2. The content-addressable memory circuit of claim 1, wherein the signal from the first local bit line is to be generated while the first local bit line is set to a first logical value.

3. The content-addressable memory circuit of claim 1, wherein the first local bit line is to be set to the first logical value when search logic associated with the first memory location indicates a mismatch between a data word stored in the first memory location and input data.

4. The content-addressable memory circuit of claim 1, wherein the first logical value of the first local bit line sets a logical value of the global bit line.

5. The content-addressable memory circuit of claim 1, wherein the global bit line accelerator does not set the second local bit line to the first logical value when the first local bit line is set to a second logical value.

6. The content-addressable memory circuit of claim 1, wherein the global bit line accelerator includes:
   a first switch coupled to the second local bit line; and
   a second switch coupled to the first local bit line, wherein the second switch is to set the second local bit line to the first logical value based on the signal generated from the first local bit line.

7. The content-addressable memory circuit of claim 6, wherein the first switch is to set the first local bit line to the first logical value based on a signal generated from the second local bit line, the signal from the second local bit line generated when the second local bit line is set to the first logical value.

8. The content-addressable memory circuit of claim 7, wherein the first and second switches are formed from transistors.

9. The content-addressable memory circuit of claim 6, wherein the global bit line accelerator further includes:
   a first inverter coupled between the first local bit line and the global bit line; and
   a second inverter coupled between the second local bit line and the global bit line;
   wherein the first inverter is to invert the first logical value of the first local bit line to form a control signal to control the second switch, said control signal corresponding to the signal from the first bit line which is generated when the first local bit line is set to the first logical value.

10. The content-addressable memory circuit of claim 9, wherein the first and second inverters have substantially equal strengths.

11. The content-addressable memory circuit of claim 9, wherein the first switch is coupled between the first local bit line and one or more pull-down transistors associated with the first memory location and the second transistor is coupled between the second local bit line and one or more pull-down transistors associated with the second memory location.

12. The content-addressable memory circuit of claim 1, wherein the first and second memory locations are adjacent locations in a memory array.

13. The content-addressable memory circuit of claim 12, wherein the first and second memory locations are adjacent memory locations within a same column of the memory array.

14. The content-addressable memory circuit of claim 1, wherein the first and second memory locations are non-adjacent locations in a memory array.

15. A method, comprising:
   comparing input data to a data stored in a first memory location of a content-addressable memory;
   setting a first local bit line to a first logical value based on the comparison; and
   setting a second local bit line to the first logical value when the first local bit line is set to the first logical value, the second bit line to be set to the first logical value depending on a signal from the first local bit line.

16. The method of claim 15, wherein the first and second local bit lines are coupled to a same global bit line, the first logical value of the first and second local bit lines setting a logical value of the global bit line.

17. The method of claim 15, wherein the logical value of the global bit line is set to the first logical value of the first and second local bit lines.

18. A system, comprising:
   a first circuit; and
   a content-addressable memory circuit that includes:
   (a) a first local bit line coupled to a first memory location;
   (b) a second local bit line coupled to a second memory location;
   (c) a global bit line coupled to the first and second local bit lines; and (d) a global bit line accelerator coupled to the first and second local bit lines and the global bit line, the global bit line accelerator to set the second local bit line to a first logical value depending on a signal from the first local bit line.

19. The system of claim 18, wherein the first logical value of the second bit line is to set a logical value of the global bit line, the logical value of the global bit line to control generation of a signal to the first circuit.

20. The system of claim 19, wherein the first circuit is one of a cache, memory, processor, power supply, display, interface circuit, communications unit, or chipset.

* * * * *